Figure 1:
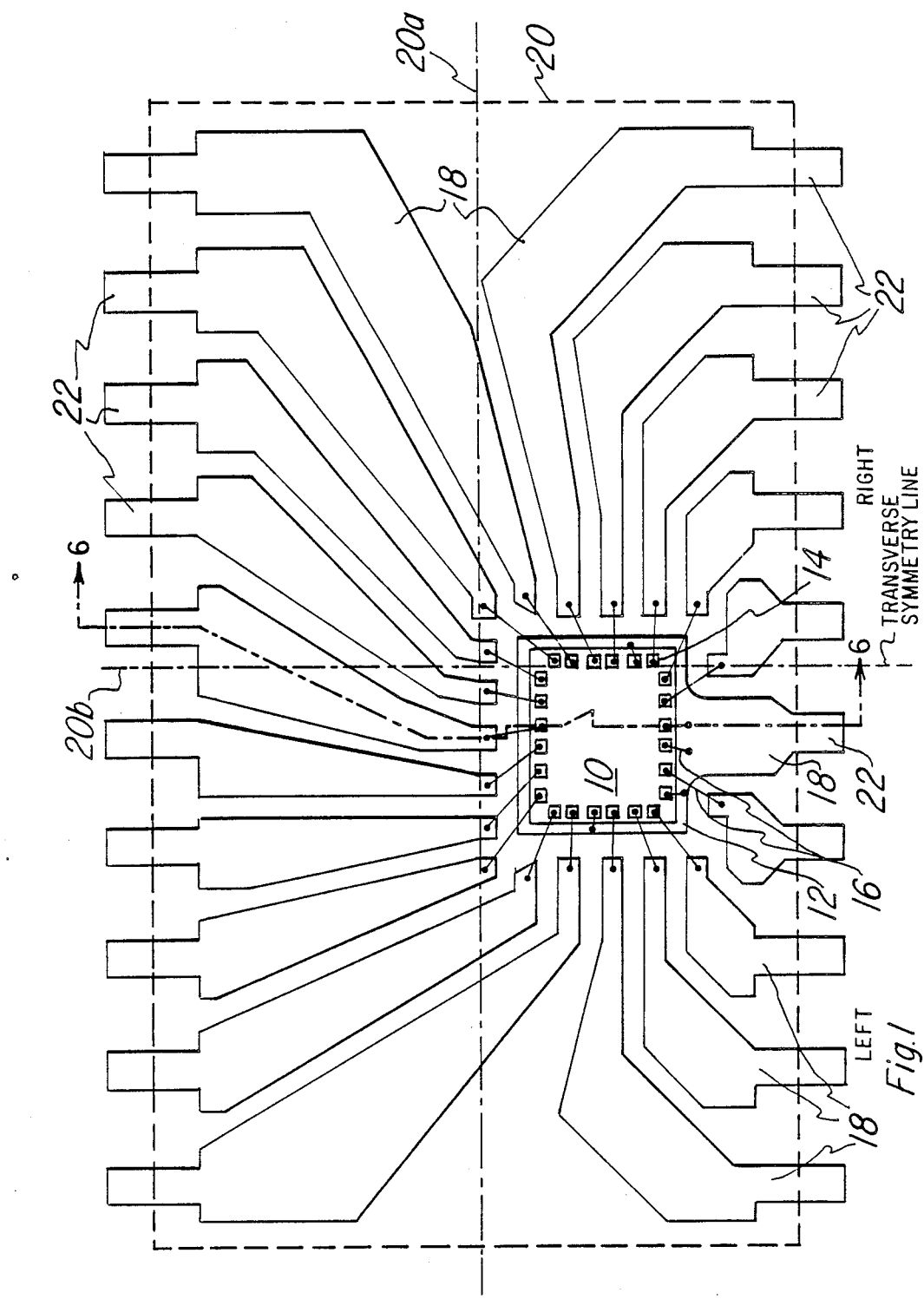

United States Patent [19]

Schuermann

[11] Patent Number: 4,982,268
[45] Date of Patent: Jan. 1, 1991

[54] SEMICONDUCTOR DEVICE PACKAGE ASSEMBLY HAIRING NON-SYMMETRICAL SEMICONDUCTOR CHIP MOUNTING WITHIN CONDUCTIBLE LEAD PATTERN

[75] Inventor: Josef Schuermann, Oberhummel, Fed. Rep. of Germany

[73] Assignee: Texas Instruments Deutschland GmbH, Fed. Rep. of Germany

[21] Appl. No.: 163,338

[22] Filed: Mar. 2, 1988

[51] Int. Cl.$^5$ ...................... H01L 23/48; H01L 23/50
[52] U.S. Cl. ........................................... 357/70; 357/68
[58] Field of Search ........................ 357/70, 14, 68, 69; 174/52.4

[56] References Cited

U.S. PATENT DOCUMENTS 4,023,053  5/1977  Shimizu et al. .................... 357/14

Primary Examiner—Rolf Hille
Assistant Examiner—S. V. Clark
Attorney, Agent, or Firm—William E. Hiller; N. Rhys Merrett; Melvin Sharp

[57] ABSTRACT

A semiconductor device package assembly including a semiconductor chip (10) which contains an electronic circuit and is mounted on a support plate (12) of electrically conductive material. Disposed substantially in the plane of the support plate (12) are conductor strips (18) which extend in the direction towards the support plate (12) and at their ends remote from the support plate (12) are formed as terminal conductors (22) for establishing connections to external electronic circuits. Selected conductor strips (18) are connected to selected points of the electronic circuit in the chip (10). A housing is provided which encloses the support plate (12), the semiconductor chip (10) and the conductor strips (18) and out of which the terminal conductors (22) project. At least one of said terminal conductors (22) serves for the application of ground. The support plate (12) on which the semiconductor chip is mounted is arranged in non-symmetrical is offset relation with respect to the conductive lead pattern as defined by the conductor strips, being offset in the direction toward the at least one terminal conductor (22) serving for the application of ground and/or integrally connected to ground.

7 Claims, 6 Drawing Sheets

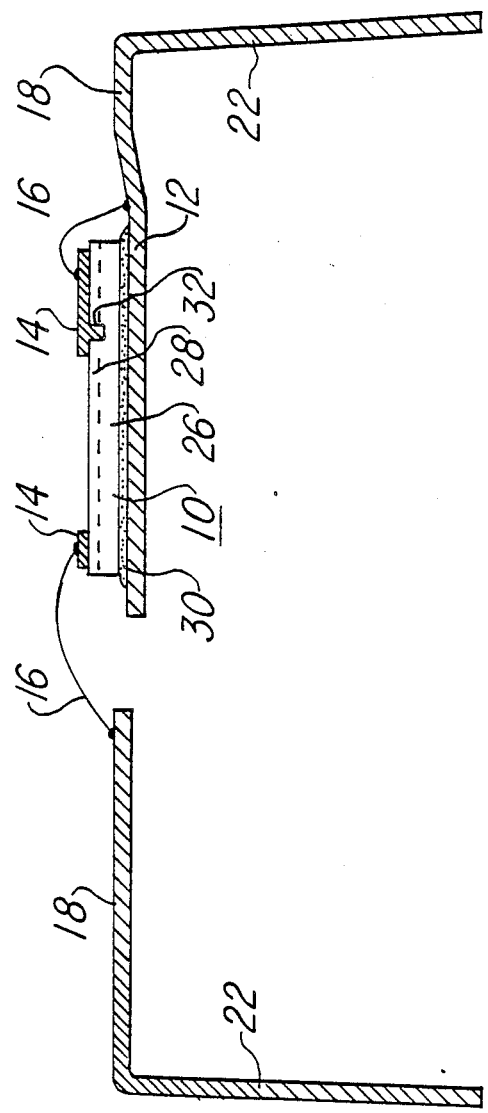

SEMICONDUCTOR DEVICE PACKAGE ASSEMBLY HAIRING NON-SYMMETRICAL SEMICONDUCTOR CHIP MOUNTING WITHIN CONDUCTIBLE LEAD PATTERN

The invention relates to a semiconductor device package assembly comprising a semiconductor chip containing an electronic circuit, a support plate of electrically conductive material on which the chip is mounted, conductor strips which are disposed substantially in the plane of the support plate and which extend towards the support plate and at their ends remote from the support plate are formed as terminal conductors for establishing connections to external electronic circuits, selected conductor strips being connected to selected points of the electronic circuit in the chip, and a housing which encloses the support plate, the chip and the conductor strips and out of which the terminal conductors project outwardly, at least one of said conductors serving for application to ground.

Semiconductor device packages of this type are at present used to a very great extent for a great variety of application fields. In particular, computer technology would be inconceivable without the development of modern integrated circuits formed in the semiconductor chips within such package assemblies. Precisely for the field of computer technology integrated circuits have been developed in CMOS technology or in bipolar technology with the aid of which switching operations can be carried out with ever increasing speeds. Switching times in the region of nanoseconds or less have already been achieved, permitting correspondingly highspeed computers. However, in the development of such integrated circuits permitting very short switching times, limits have been reached which are due not to the technology used in implementing the electronic circuit in the semiconductor chip but to the housing forms usual at present. The terminal conductors or conductor strips via which the connection is established between the electronic circuit on the chip and the external circuits have a certain geometrical length so that at high frequencies they behave like an inductance which counteracts a high switching speed. The presence of the not negligible line inductance of the conductor strip has a serious disadvantage which makes it almost impossible to utilize the high switching speeds which with the semiconductor technology could be achieved with the electronic circuit itself in a semiconductor chip. On a rapid current increase in the conductor strip serving for supplying ground potential, a voltage is induced in said conductor strip which briefly raises the ground level at the chip. This can go so far that the switching threshold of the circuit is exceeded so that at a conductor strip connected to an output, the transition from one significant signal level (L level) to the other significant signal level (H level) is simulated without an input signal change being present. This puts limits on using ever higher switching speeds.

This problem of the raising of the ground potential at high switching speeds has led to integrated circuits which have up to four ground terminals for the purpose of holding the electronic circuit on the chip more strictly at ground potential. An example of such a solution is found in the pamphlet issued in 1986 by Texas Instruments under the title "Enhanced Performance Implanted CMOS (EPIC) Advanced CMOS Logic (ACL)" by Martha M. Weinstein et al. However, this solution is at the expense of the size of the integrated circuit so that it counteracts the desired miniaturization and consequently cannot be used in all cases. Moreover, with this solution as before each single one of the conductor strips applied to ground potential is connected via a very thin bonding wire to ground points of the electronic circuit on the chip so that there is still a not negligible line inductance between the ground terminal conductors lying outside the housing and the electronic circuit.

The problem underlying the invention is to provide a semiconductor device package assembly having a semiconductor chip in which an integrated circuit is formed of the type outlined at the beginning in which the high switching speeds possible with the semiconductor technology can be utilized far better by the electronic circuits present on the chip.

This is achieved according to the invention by providing a semiconductor device package in which the semiconductor chip having the integrated circuit formed therein is mounted on a support plate which is arranged in non-symmetrical offset relation with respect to the conductive lead pattern provided for the chip in the direction toward the at least one terminal conductor of the conductive lead pattern serving for the application of ground.

A further solution of this problem resides in that the support plate is connected integrally to the at least one terminal conductor serving for the application of ground. In addition the problem underlying the invention is solved in that the support plate is arranged in non-symmetrical offset relation with respect to the conductive lead pattern in the direction toward the at least one terminal connected integrally to said terminal conductor.

In integrated circuits formed in semiconductor chips packaged according to the invention, the series inductance between the terminal conductors serving for the application of ground and the electronic circuit on the chip is substantially reduced so that appreciably higher switching speeds can be obtained without the disadvantages outlined above occurring. It suffices to use a single ground terminal conductor so that no increase in the dimensions of the integrated circuit is necessary to obtain the higher switching speeds.

Figure 2:
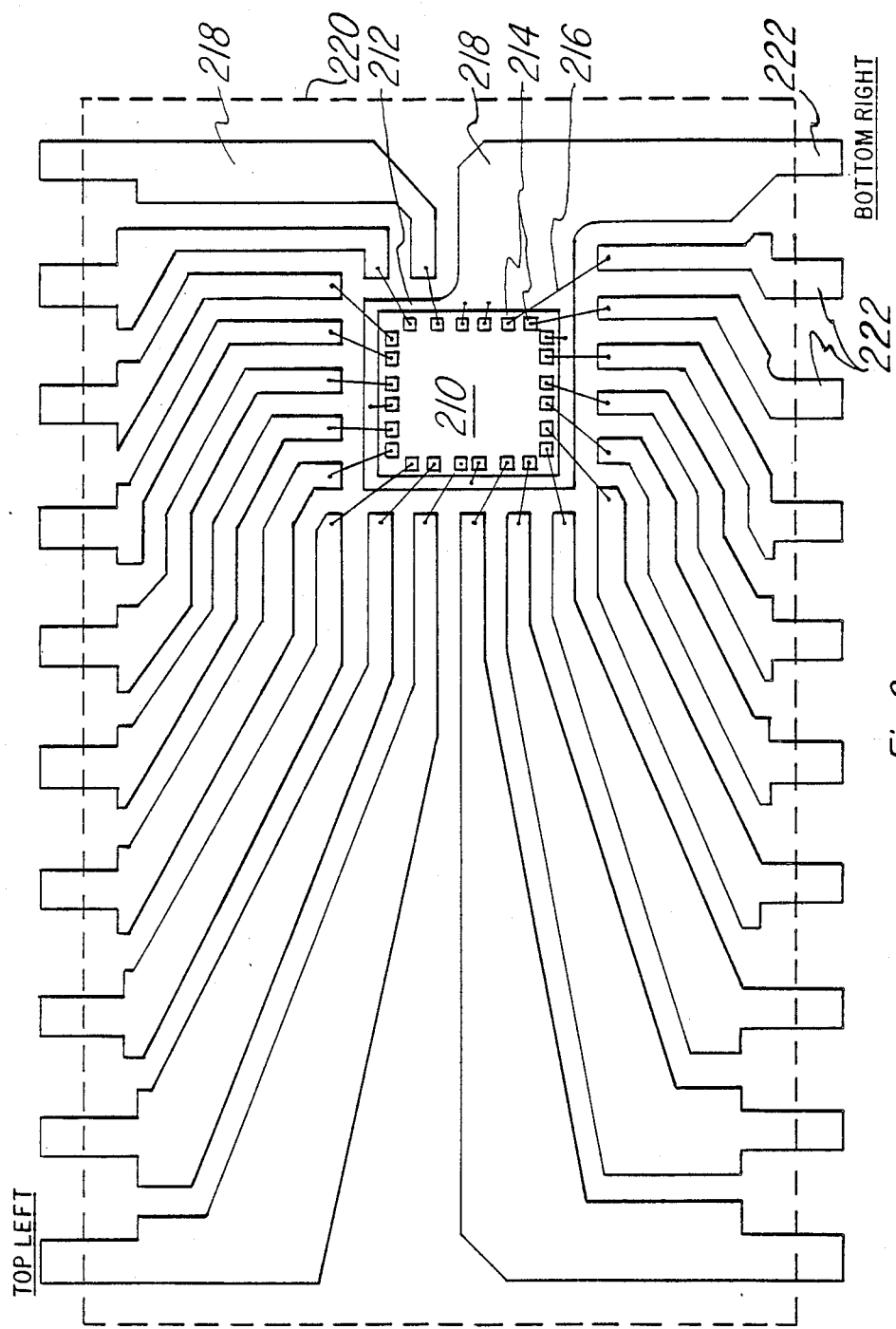
Figure 3:
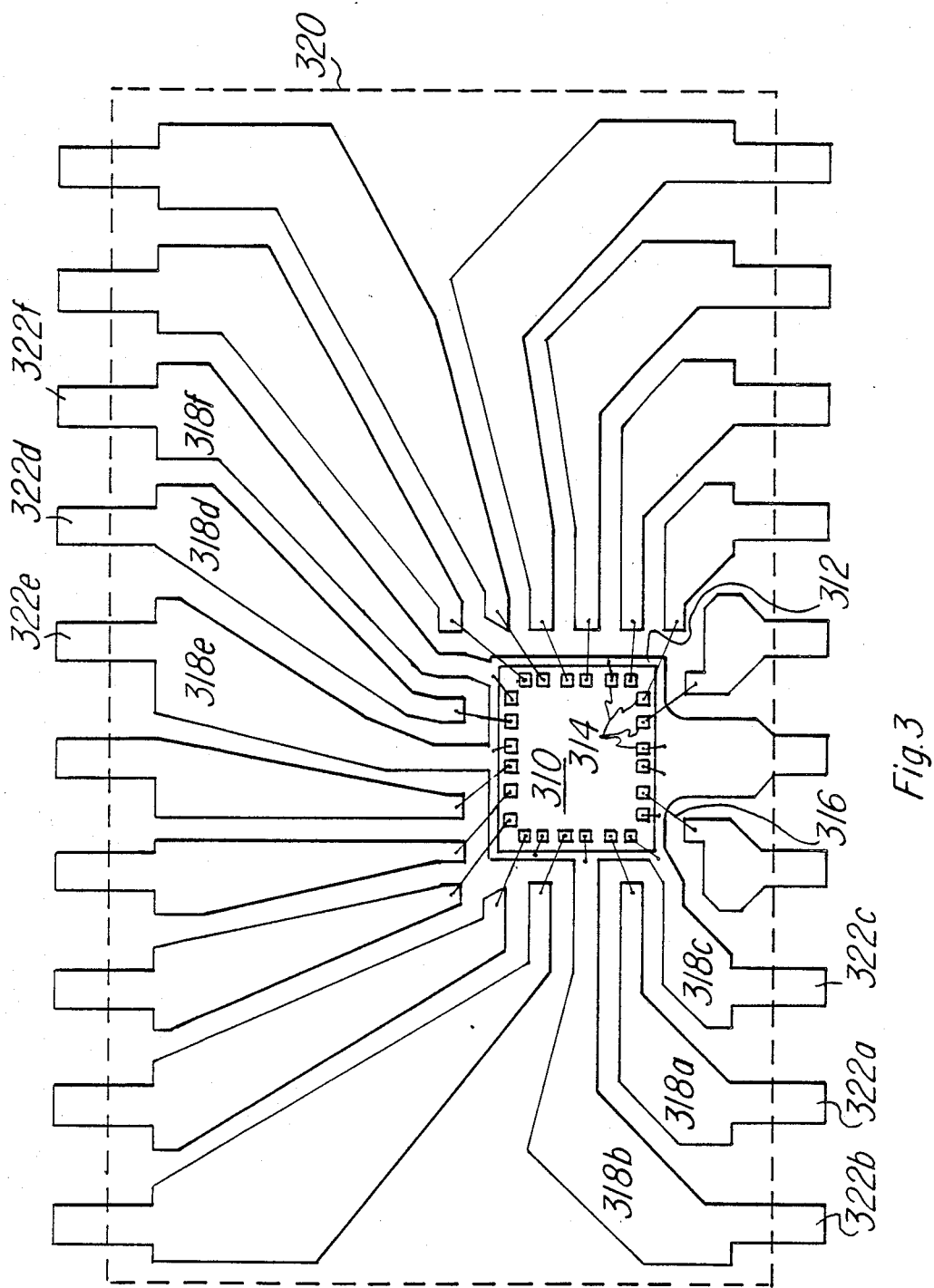
Figure 4:
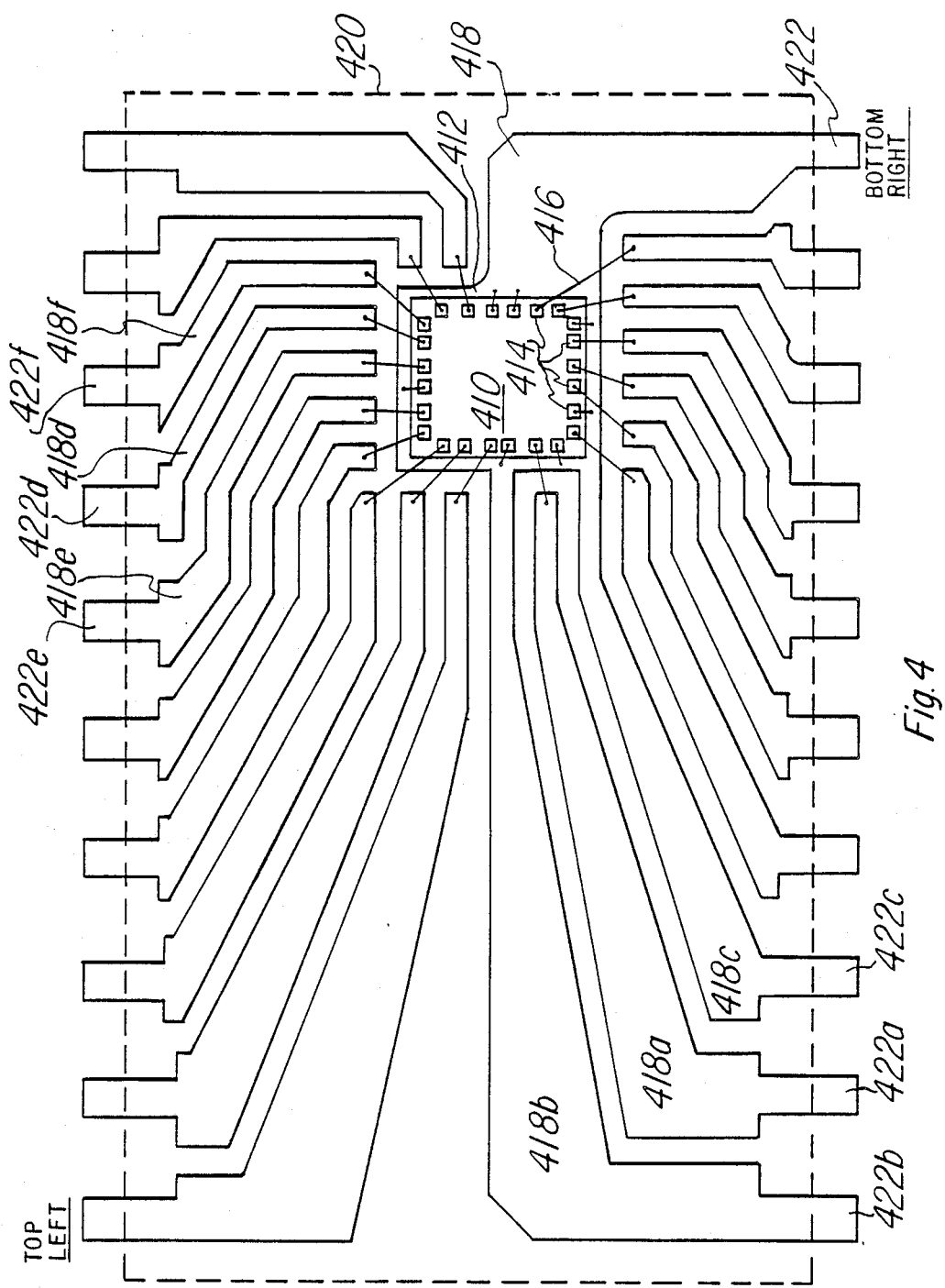
Figure 5:
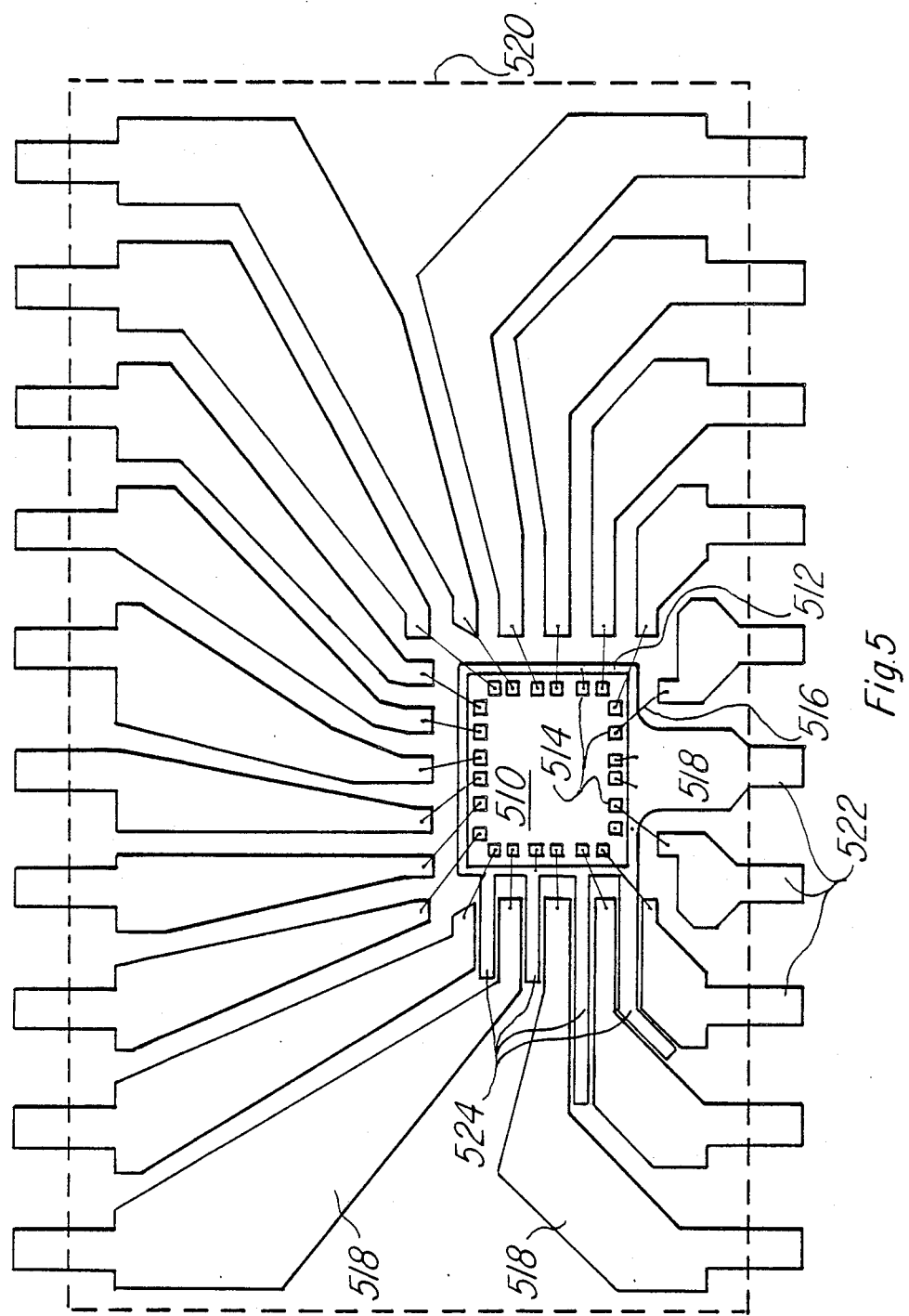

Further advantages of the semiconductor device package assembly according to the invention will be apparent from the following description of embodiments thereof in which reference is made to the drawings, wherein:

FIG. 1 is a plan view of the arrangement of the support plate and the conductor strips in a conductive lead pattern for a semiconductor chip having an integrated circuit formed therein according to the invention, FIG. 2 is a similar view to FIG. 1 of a further embodiment of the invention, FIG. 3 is a further development of the embodiment of FIG. 1 which is particularly suitable for use in high-frequency circuits, FIG. 4 is a further development of the embodiment of FIG. 2 also particularly suitable for use in high-frequency circuits, FIG. 5 shows a further development of the arrangement illustrated in FIG. 1 with steps for preventing cross-talk between output conductors, and FIG. 6 is a section along the line 6—6 of FIG. 1.

FIG. 1 shows the inner structure of an integrated circuit in a dual in-line ("DIL") housing or a small outline ("SO") housing. The invention may however also be used with plastic chip carrier ("PLCC") housings or similar housings or cases. The core of the integrated circuit is a semiconductor chip 10 in which using known diffusion or implantation techniques an electronic circuit has been implemented. The chip 10 is connected by means of a conductive adhesive to a support plate 12.

For supplying the supply voltage and applying input signals as well as taking off output signals contact points 14 are formed on the chip 10 and are in connection via bond wires 16 with conductor strips 18. The conductor strips 18 lie substantially in the same plane as the support plate 12; the surface of the support plate 12 is only slightly lower than the surface of the conductor strip 18 so that the surface of the chip 10 disposed on the support plate 12 does not come to lie too far above the surface of the conductor strips 18. Since however the chip is very thin the lowering of the support plate 12 with respect to the conductor strips 18 is also only slight.

The chip 10, the support plate 12 and the conductor strips 18 are potted in a plastic compound which forms the case or housing 20 of the integrated circuit. The outline of this housing 20 is indicated in dashed line in FIG. 1; it has a rectangular base form with a longitudinal plane of symmetry 20a and a transverse line of symmetry 20b.

The conductor strips 18 are formed at the ends remote from the support plate 12 as terminal conductors 22 which project out of the housing 20. Said terminal conductors 22 are bent almost at right-angles directly after emerging from the housing 20 and can be inserted into the connector base or alternatively soldered directly to printed circuit boards. In the sectional view of FIG. 6 this bending of the terminal conductors 22 can be seen.

With integrated circuits of the type usual at present, the various manufacturers keep to a specific connection scheme in particular as regards applying the supply voltage. To obtain this standardization, the manner of numbering the terminal conductors 22 projecting out of the housing 20 is defined and in the illustration of FIG. 1 the counting starts with the terminal conductor lying at the bottom left and goes on counterclockwise. In the embodiment of the integrated circuit illustrated in FIG. 1, the terminal conductors 22 which are numbered "one" through "ten" as determined as by standardized numbering procedure lie on the side of the integrated circuit lying at the bottom in the illustration and the terminal conductors 22 numbered "eleven" through "twenty" by the standardized numbering procedure lie on the side lying at the top. The terminal conductor 22 numbered five serves in this embodiment for applying ground and the terminal conductor 22 numbered fifteen serves for the connection to the positive terminal of the supply voltage source.

As apparent from the illustration of FIG. 1 the support plate 12 is offset with respect to a central location within the conductive lead pattern defined by the conductor strips 18 and the terminal conductors 22 at the ends thereof in a direction toward the terminal conductor 22 serving for the application of ground so that the conductor strip 18 leading from the terminal conductor 22 to the support plate 12 is greatly shortened. In addition the conductor strip 18 is integrally connected to the support plate 12, thus giving a very good ground connection. The shortening of the conductor strip 18 also gives an appreciable reduction of the series inductance of this conductor strip and this has a favourable effect on the high-frequency behaviour. For applying ground to the electronic circuit contained in the chip 10 it suffices to attach a very short bond wire 16 between the support plate 12 the corresponding contact point 14 on the chip 10. In this manner the series inductance effective between the terminal conductor 22 and the contact point 14 on the chip 10 serving for applying ground is kept small. The low series inductance results in the ground potential in the electronic circuit in the chip 10 not being appreciably raised when a current pulse with steep switching flank flows via the terminal conductor 22 and the conductor strip 18 to the electronic circuit in the chip 10. The offset arrangement of the support plate 12 provides room permitting the conductor strip 18 serving for the application of the positive supply voltage to be made wider. This also results in a reduction of the series inductance in said terminal conductor.

Should it be found necessary to apply several contact points 14 on the chip 10 to ground this can be done simply in that the corresponding contact point 14 is connected via a very short bond wire to the support plate 12 lying at ground. This is indicated at several points in FIG. 1.

Should it be found necessary to obtain a further reduction of the series inductance in the ground conductor then for example two, three or even four conductor strips 18 could be directly integrally connected to the support plate 12 (in the manner of the embodiments of FIGS. 3 and 4, for example, to be described hereinafter) and ground then applied from outside to each of the four corresponding terminal conductors 22 of said conductor strips 18.

In the embodiment of FIG. 1 the support plate 12 is not only offset with respect to a central location within the conductive lead pattern in the direction toward the terminal conductor 18 serving for the application of ground but as apparent from the illustration of FIG. 1 is offset toward a narrow side of the housing 20, giving a further advantageous effect. To obtain rapid switching flanks in particular the series inductances of conductor strips 18 leading to the circuit outputs are of significance. Furthermore, the mutual influencing arising at high output currents in adjacent conductors due to switching operations, i.e. cross-talk, is proportional to the conductor length. In the embodiment of FIG. 1 the terminal conductors 22 lying on the left of the transverse symmetry line 20b are the terminal conductors at which the output signals are emitted. By the offsetting of the support plate 12 in the direction towards the left housing half as defined by the portion of the housing on the left of the transverse symmetry line 20b, i.e. in the direction towards the terminal conductors 22 serving for furnishing output signals, the corresponding conductor strips 18 are shortened and this results in a reduction of the respective series inductances.

Since the support plate 12 is integrally connected to the ground terminal conductor 22 via the conductor strip 18 it is not necessary to secure the support plate 12 via support strips during the production of the integrated circuit, i.e. prior to embedding in the plastic material forming the housing, as was necessary in hitherto known integrated circuits. Said support strips extended from the support plate to the particular housing narrow side and took up space then not available to the conductor strips 18. In the embodiment of FIG. 1 these support strips can be omitted so that accordingly the conductor strips 18 extending in the direction towards the support plate 12 can be made wider. This widening gives a further reduction of the respective series inductances and this has a positive effect in particular on the conductor strips 18 which conduct the output signals to the corresponding terminal conductors 22. For in these conductor strips 18 high currents flow which accordingly also with correspondingly fast switching flanks would induce high counter-voltages which would counteract the desired steep switching flanks.

The embodiment of the integrated circuit illustrated in FIG. 1 thus has low series inductances at all regions necessary for obtaining steep switching flanks and therefore enables the switching speeds obtainable using modern CMOS and bipolar technology to be implemented as far as possible in practice. This is due to all the features outlined above, i.e. the offsetting of the support plate 12, the integral connection of the support plate 12 to the ground terminal conductor 22, the offsetting of the support plate 12 in the direction to the terminal conductors 22 emitting the output signals and the widening of the conductor strips 18 carrying the higher currents. These features need not always be used together because each individual feature itself results in a reduction of the detrimental series inductances.

FIG. 2 shows an embodiment of the invention based on a standard form of an integrated circuit in which the ground terminal and the terminal conductor to be connected to the positive terminal of the power voltage source lie at diagonally opposite corners of the housing 220. For parts in FIG. 2 corresponding to similar parts in FIG. 1, the same reference numerals are used as in FIG. 1 with the number "2" added as a prefix. The terminal conductor 222 to which ground is applied is at the bottom right in FIG. 2 and the terminal conductor 222 to be connected to the positive terminal of the power voltage source is at the top left. Otherwise the description of FIG. 1 applies to the embodiment of FIG. 2 as well. By the direct connection of the support plate 212 to the ground terminal conductor 222 via the conductor strip 218 the detrimental series inductances of the ground lead is reduced so that said integrated circuit permits higher switching speeds, i.e. steeper switching flanks.

FIG. 3 shows an embodiment of an integrated circuit which can be used in particular in the high-frequency range, in particular in the UHF range. Parts in FIG. 3 corresponding to similar parts in FIG. 1 are identified by the same reference numerals used in FIG. 1 with the number "3" added as a prefix. In the high-frequency range, frequent use is made of so-called strip lines on printed circuit boards via which the high-frequency signals must be conducted to the chip 310 then processing said signals in the integrated circuit. The signal-carrier conductor, which in high-frequency technology is often referred to as the "hot" conductor, is applied in this embodiment of FIG. 3 for example to the terminal conductor 322a and supplied via the conductor strip 318a to the chip 310. The conductor strips 318b and 318c extending on either side of the conductor strip 318a in the housing 320 are directly connected to the support plate 312 which as in the previously described embodiments is connected directly to ground and they are also directly connected to ground via the terminal conductors 322b and 322c. They thus provide a very good shielding of the conductor strip 318a so that the arrangement of the three terminal conductors 318a, 318b and 318c acts like a continuation of a strip line or also a coaxial line leading directly up to the semiconductor chip 310. By suitable dimensioning of the spacings, it is even possible to achieve adaptation to the impedance of the supply lead. The high-frequency signal emitted by the circuit in the chip 310 can be supplied via the conductor strip 318d to the terminal conductor 322d, the conductor strips 318e and 318f extending on either side of the conductor strip 318d being connected directly to the support plate 312 and applied to ground via the terminal conductors 322e and 322f. The group of the conductor strips 318d, 318e and 318f thus behaves like a strip line or coaxial line extending directly up to the chip 310.

FIG. 4 shows the application of the idea described in conjunction with FIG. 3 to an integrated circuit in which ground and the supply voltage are applied at the terminal conductor lying at the bottom right and at the top left respectively. In FIG. 4, corresponding to similar parts in FIG. 3 parts are denoted by reference numerals as employed in FIG. 3 except that the first number of each reference numeral begins with a "4" rather than a "3".

In the embodiment of FIG. 5, which is basically similar to the structure of the embodiment of FIG. 1, parts corresponding to similar parts in FIG. 1 are identified by the same reference numerals used in FIG. 1 with the number "5" added as a prefix. In FIG. 5, between the terminal conductors 522 serving to carry away output signals, shield conductor strips 524 are disposed which effect a decoupling of the signals transmitted to the output conductor strips 518. This greatly reduces any cross-talk between these output conductor strips 518. Attachment of the shield conductor strips 524 is made possible because as mentioned above in conjunction with FIG. 1, for supporting the support plates 512 during fabrication, no special support strips are necessary and consequently the corresponding space is available for the attachment of the shield conductor strips 524.

In the section illustrated in FIG. 6 along the line 6—6 of FIG. 1 it can be seen how the connection between the support plate 12 and a ground contact point 14 on the chip 10 and the connection between a conductor strip 18 and another contact point 14 is established via bond wires 16. The chip 10 comprises a substrate 26 of low-resistance semiconductor material on which a high-resistance epitaxial layer 28 is formed in which the actual electronic circuit is disposed. Between the support plate 12 and the semiconductor chip 10 there is an adhesive 30 consisting of conductive resin.

To obtain a further improvement of the high-frequency behaviour and permit steep switching flanks, at least one contact point 14 serving for the application of ground is connected via a corresponding contact window 32 in the epitaxial layer 28 to the substrate 26. As a result, the active zones in the high-resistance epitaxial layer 28 are also applied well to ground potential and a low-resistance connection results between the zones concerned through said layer via the low-resistance substrate 26 and the support plate 12 applied to ground. This serves to further improve the high-frequency behaviour of the electronic circuit formed in the epitaxial layer 28.

In addition the contacting faces and the connecting lines on the surface of the semiconductor chip 10 which are in connection with ground form with the support plate a capacitor which for high frequencies forms a short-circuit between the active zones in the chip applied to ground and the support plate 12. The aforementioned low-resistance connection between the active zones involved and the support plate 12 effects a low-resistance damping of said capacitor so that no detrimental HF resonance phenomena can occur.

I claim:

1. A semiconductor device assembly comprising:
   a semiconductor chip having an electronic circuit provided thereon;
   a support plate of electrically conductive material on which said semiconductor chip is mounted;
   a conductive lead pattern at least substantially surrounding said support plate, said conductive lead pattern comprising a plurality of conductor strips disposed substantially in the plane of said support plate and being arranged about the perimeter of said support plate in outwardly extending relationship with respect thereto;
   the ends of said conductor strips remote from said support plate defining terminal conductors for establishing electrical connections to external electronic structures;
   means connecting selected conductor strips to selected points of said electronic circuit on said chip;
   at least one of said conductor strips providing a terminal conductor at its end remote from said support plate adapted to be connected to ground;
   said support plate being arranged in non-symmetrical offset geometrical relation with respect to a central location within said conductive lead pattern in the direction toward said terminal conductor adapted to be connected to ground such that the length of said at least one conductor strip providing said terminal conductor adapted to be connected to ground is relatively short in comparison to the lengths of other conductor strips located about a portion of the perimeter of said support plate other than that adjacent to said at least one conductor strip; and
   a housing enclosing said support plate, said semiconductor chip, and said plurality of conductor strips with the terminal conductors at the ends of said conductor strips remote from said support plate projecting outwardly of said housing.

2. A semiconductor device assembly as set forth in claim 1, wherein said at least one conductor strip providing said terminal conductor adapted to be connected to ground is integrally connected to said support plate.

3. A semiconductor device assembly as set forth in claim 2, wherein said housing has a rectangular configuration with longitudinal and transverse symmetry planes;
   said at least one conductor strip providing said terminal conductor adapted to be connected to ground being disposed in a region in proximity to be transverse symmetry plane of said housing;
   the remaining conductor strips and the terminal conductors corresponding thereto of said conductor lead pattern including conductor strips with terminal conductors serving for the application of input signal thereto and conductor strips with terminal conductors serving for the emission of output signals;
   said terminal conductors of said conductor strips serving for the application of input signals being arranged on one side of said transverse symmetry plane of said housing;
   said terminal conductors of said conductor strips serving to emit output signals being arranged on the other side of said transverse symmetry plane of said housing; and
   said support plate being arranged in non-symmetrical offset geometrical relation with respect to a central location within said conductive lead pattern in the direction toward the terminal conductors of said conductor strips serving for the emission of output signals.

4. A semiconductor device assembly as set forth in claim 3, wherein the conductor strips having the terminal conductors serving to emit output signals are wider than the conductor strips having the terminal conductors serving for the application of input signals.

5. A semiconductor device assembly as set forth in claim 4, further including shield conductor strips respectively disposed in the spaces between adjacent conductor strips having terminal conductors serving to emit output signals; and
   said shield conductor strips being integrally connected to said support plate.

6. A semiconductor device assembly as set forth in claim 3, wherein said semiconductor chip on said support plate includes a substrate of relatively low-resistance semiconductor material connected to said support plate in electrically conductive relationship;
   an epitaxial high-resistance semiconductor layer on said substrate;
   said electronic circuit being provided by said epitaxial semiconductor layer;
   a bond connection between said support plate and at least one ground connection point of said electronic circuit in said epitaxial layer;
   said epitaxial layer having a contact window provided therein communicating with said substrate; and
   said at least one ground connection point of said electronic circuit connecting said substrate to ground via the contact window in said epitaxial layer.

7. A semiconductor device assembly as set forth in claim 1, wherein said conductor strips disposed on opposite sides of at least one conductor strip having a terminal conductor serving for the application of an input signal thereto and the conductor strips disposed on opposite sides of at least one conductor strip having a terminal conductor serving to emit output signals are integrally connected to said support plate.

* * * * *

UNITED STATES PATENT AND TRADEMARK OFFICE
CERTIFICATE OF CORRECTION

PATENT NO. : 4,982,268

DATED : January 1, 1991

INVENTOR(S) : Josef Schuermann

It is certified that error appears in the above-identified patent and that said Letters Patent is hereby corrected as shown below:

On the cover page of the patent as issued, after the item identified as "[54]", the title of the invention should read --SEMICONDUCTOR DEVICE PACKAGE ASSEMBLY HAVING NON-SYMMETRICAL SEMICONDUCTOR CHIP MOUNTING WITHIN CONDUCTIVE LEAD PATTERN--.

Column 1, lines 2-5, the title should read --SEMICONDUCTOR DEVICE PACKAGE ASSEMBLY HAVING NON-SYMMETRICAL SEMICONDUCTOR CHIP MOUNTING WITHIN CONDUCTIVE LEAD PATTERN--.

Signed and Sealed this

Twenty-first Day of July, 1992

Attest:

DOUGLAS B. COMER

*Attesting Officer*   *Acting Commissioner of Patents and Trademarks*